United States Patent [19]

Phillips et al.

[11] Patent Number: 5,523,709
[45] Date of Patent: Jun. 4, 1996

[54] POWER-ON RESET CIRCUIT AND METHOD

[75] Inventors: William A. Phillips, Royal Oak; Clyde A. Marlow, Ann Arbor, both of Mich.

[73] Assignee: SGS-Thomson Microelectronics, Inc., Carrollton, Tex.

[21] Appl. No.: 346,745

[22] Filed: Nov. 30, 1994

[51] Int. Cl.⁶ .................................................. H03K 17/22
[52] U.S. Cl. ........................ 327/143; 327/198; 327/205
[58] Field of Search ................................. 327/143, 198, 327/205, 206

[56]     References Cited

U.S. PATENT DOCUMENTS

| | | | |
|---|---|---|---|
| 5,136,181 | 8/1992 | Yukawa | 327/143 |
| 5,302,861 | 4/1994 | Jelinek | 327/143 |

FOREIGN PATENT DOCUMENTS

| | | | |
|---|---|---|---|
| 63-266921 | 11/1988 | Japan | 327/143 |
| 4-72912 | 3/1992 | Japan | 327/143 |
| 4-117714 | 4/1992 | Japan | 327/143 |
| 4-347925 | 12/1992 | Japan | 327/143 |
| 5-22100 | 1/1993 | Japan | 327/143 |
| 5-183416 | 7/1993 | Japan | 327/143 |

*Primary Examiner*—Terry Cunningham
*Attorney, Agent, or Firm*—Joseph C. Arrambide; Lisa K. Jorgenson

[57]     ABSTRACT

A circuit and method for generating a power-on reset signal with a designable hysteresis is disclosed. The circuit includes a low voltage stage, a high voltage stage, and a hysteresis stage. The low voltage stage includes a resistor in series with a current mirror. The high voltage stage includes a current mirror in series with a diode and two resistors. The hysteresis circuit includes a transistor connected across one of the two resistors. The method for generating the power-on reset signal includes the steps of sinking a power-on reset signal low when a voltage source reaches a first $V_{be}$ voltage threshold; driving the power-on reset signal high when the voltage source reaches a second threshold value; and providing hysteresis to the power-on reset signal.

17 Claims, 2 Drawing Sheets

POWER-ON RESET CIRCUIT AND METHOD

BACKGROUND OF THE INVENTION

1. Field of the Invention

This invention relates to electronic circuits used to generate a power-on reset signal and more specifically to an electronic circuit used to generate a power-on reset signal with adjustable hysteresis.

2. Description of the Relevant Art

The problem addressed by this invention is encountered by systems which depend on a good voltage source for the reliable operation of the system. Common examples of such systems are a microprocessor based system such as a personal computer, an automobile, or a radio. In fact, most consumer and non-consumer products which use electronics have a way to enable the operation of the electronics, such as a power-on reset circuit, when a reliable power source is available and disabling the operation of the electronics when the reliable power source is not available.

In a personal computer, a power supply converts alternating current voltage into a direct current voltage, typically 5 volts. When the computer is turned on, the power supply may take hundreds of milliseconds to reach a stabilized voltage of around 5 volts. However, the microprocessor in the personal computer can operate unreliably at voltages below 4.5 volts. Since the microprocessor is capable of operating thousands of instructions in a single millisecond and can run unreliably at voltages below 4.5 volts, running the microprocessor at voltages below 4.5 volts could yield disastrous results. Data could be corrupted or lost. Erroneous messages or command signals could be sent. The possibilities for disaster are endless. Consequently, system designers typically disable the microprocessor until the power supply has reached a sufficient and stable voltage for the microprocessor to operate reliably. By disabling the microprocessor with a power-on reset circuit until the power supply provides a known good voltage, errors in the microprocessor due to low voltage and/or noise are avoided.

FIG. 1 shows a typical power-on reset circuit 12 as known in the prior art. In this circuit, Vcc voltage 2 represents the voltage from a power supply which is not shown and POR 10 represents the power-on reset signal which is generated by a Schmitt trigger 8. Before the power supply is turned on, the POR 10 is low since capacitor 6 is discharged and since the Schmitt trigger 8 does not have any source of power (since it is also powered by the power supply). When the power supply is turned on, the Vcc voltage 2 rises and begins to charge capacitor 6 through resistor 4 and power the Schmitt trigger 8. Until the Schmitt trigger 8 has sufficient voltage to operate, its output is in an indeterminate state. When the voltage on capacitor 6 reaches the threshold voltage of the Schmitt trigger 8, the output of the Schmitt trigger changes to a high state and thus the POR signal 10 swings to a high state.

Prior art power-on reset circuit 12 in FIG. 1 is limited to situations where Vcc has a rise time at turn-on that is much faster than the RC time constant. As a result, large resistors and capacitors are required for those power supplies which have long rise times. The large capacitors can use a significant amount of area on an integrated circuit. Additionally, the POR output is indeterminate at VCC voltages below the operating voltage of the Schmitt trigger 8.

FIG. 2 shows a second power-on reset circuit 28 as known in the prior art. In this circuit, Vcc voltage 14 represents the voltage from a power supply and POR signal 27 represents the power-on reset signal which is generated by the comparator 26. In operation, POR signal 27 is initially at a low voltage as Vcc voltage begins to rise from a power supply off condition. The voltage at the non-inverted input of comparator 26 is controlled by the voltage divider created by resistor 22 and resistor 24. The voltage at the inverted input of comparator 26 is controlled by the voltage divider created by resistor 16 and diodes 18 and 20. As Vcc 14 rises, the non-inverted input rises proportional to Vcc 14 as defined by the resistance of resistor 22 and 24. The inverted input rises in voltage with the Vcc voltage 14 until Vcc 14 reaches the threshold voltage of diodes 18 and 20, typically 0.7 volts each. POR 27 goes high when:

$$(V_{cc} * r_{24})/r_{22}+r_{24} > V_{18}+V_{20}$$

Where

Vcc is the voltage of Vcc 14, $r_{22}$ is the resistance of resistor 22, $r_{24}$ is the resistance of resistor 24, $V_{18}$ is the forward voltage drop of diode 18, $V_{20}$ is the forward voltage drop of diode 20.

The problem with this prior art circuit is that signal POR 27 is indeterminate when the Vcc voltage 14 is below the operating voltage of the comparator 26. Additionally, the circuit does not have any hysteresis or is limited to the hysteresis of comparator 26 which is not easily modified. Additionally, the component count is high when the components which are required to make a comparator are included.

SUMMARY OF THE INVENTION

Therefore, it is an object of the invention to provide a power-on reset circuit which has no dependence on Vcc rise times.

It is further an object of this invention to have a determinate output at low Vcc voltages.

It is further an object of the invention to have programmable hysteresis.

It is further an object of the invention to have a simple power-on reset circuit with a low component count and therefore high reliability.

It is further an object of the invention to minimize the area required to implement the circuit on an integrated circuit.

These and other objects, features, and advantages of the invention will be apparent to those skilled in the art from the following detailed description of the invention, when read with the drawings appended claims.

DETAILED DESCRIPTION OF THE PREFERRED EMBODIMENT

Figure 1:
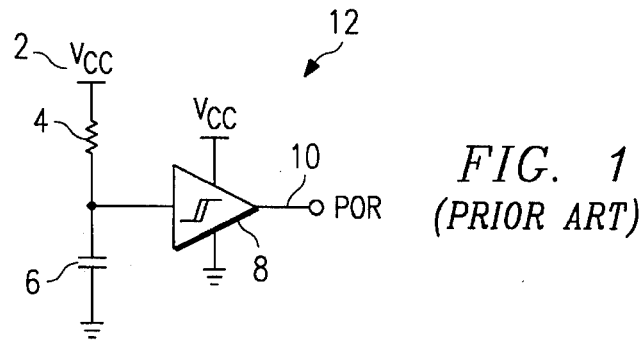
FIG. 1 is a power-on reset circuit using a resistor, capacitor, and schmitt trigger as known in the prior art.
Figure 2:
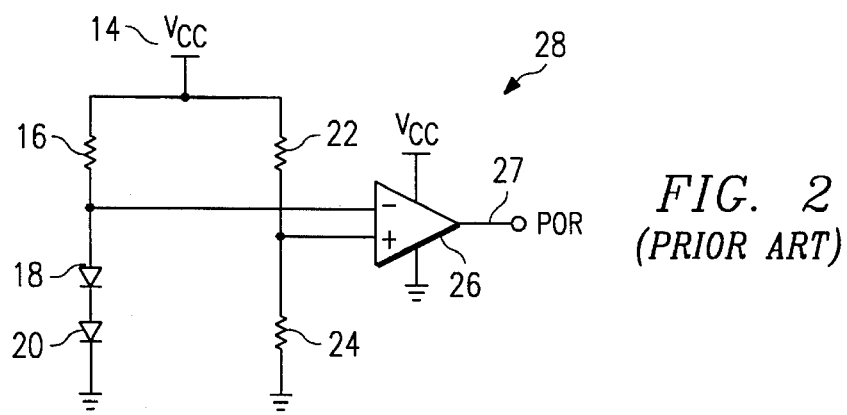
FIG. 2 is a power-on reset circuit using voltage dividers and a comparator as known in the prior art.

A power-on reset circuit 30 constructed according to the preferred embodiment of the invention will be described relative to FIG. 3. The power-on reset circuit 30 includes three circuits: a low voltage stage, a high voltage stage, and a hysteresis circuit. The low voltage stage includes resistor 44, NPN transistor 46, and NPN transistor 50. The high voltage stage includes PNP transistors 34 and 48, diode 36, resistor 38 and resistor 42. The hysteresis stage includes n-channel transistor 40.

Figure 3:
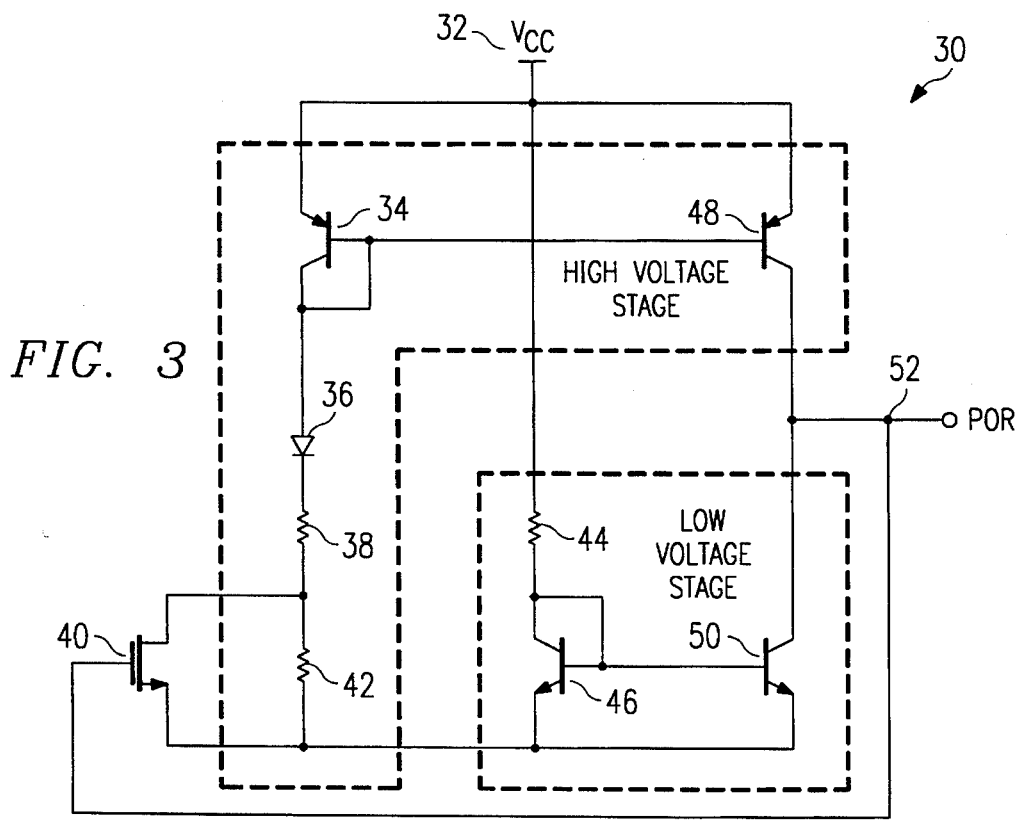
FIG. 3 is the power-on reset circuit in accordance with the preferred embodiment of the invention.

More specifically, FIG. 3 shows a Vcc voltage 32 connected to an emitter of a PNP bipolar transistor 34, an emitter of a PNP bipolar transistor 48, and a first end of a resistor 44. The base of transistor 34 is connected to its collector, to an anode of a diode 36, and to the base of transistor 48. The cathode of diode 36 is connected to a first end of resistor 38. A second end of resistor 38 is connected to a drain of an n-channel transistor 40 and a first end of resistor 42. The source of transistor 40 and a second end of resistor 42 are connected to voltage reference, ground. The second end of resistor 44 is connected to a collector of a NPN bipolar transistor 46. The emitter of transistor 46 is connected to ground. The Collector of transistor 48 is connected to a collector of a NPN bipolar transistor 50 and to a gate of transistor 40, and drives node 52 to provide the output of the power-on reset circuit 30. The base of transistor 50 is connected to the base and collector of transistor 46 and to the second end of resistor 44. The emitter of transistor 50 is connected to ground.

In operation, transistor 46 turns on when Vcc rises above the $V_{be}$ voltage of transistor 46, typically 0.7 volts. Since the base of transistor 46 is coupled to the base transistor 50, transistor 50 mirrors the current in transistor 46 and thus sinks current from node 52 and holds the POR signal low. Consequently, this circuit is advantageous over the prior art since the POR signal 52 is not indeterminate at Vcc voltages greater than around 0.7 volts.

As Vcc continues to rise, Vcc reaches a voltage sufficient to turn on transistor 34 and diode 36, typically around 1.4 volts. Since the base of transistor 34 is connected to the base of transistor 48, current begins to flow through transistor 48 and into node 52. The POR will signal stay low until the current in transistor 48 is equal to the current in transistor 50. At that point, the POR signal will quickly switch to a high state which will turn on transistor 40. With transistor 40 on, resistor 42 is bypassed which allows even more current to flow through transistor 34 and 48 which creates hysteresis in the circuit.

Figure 4:
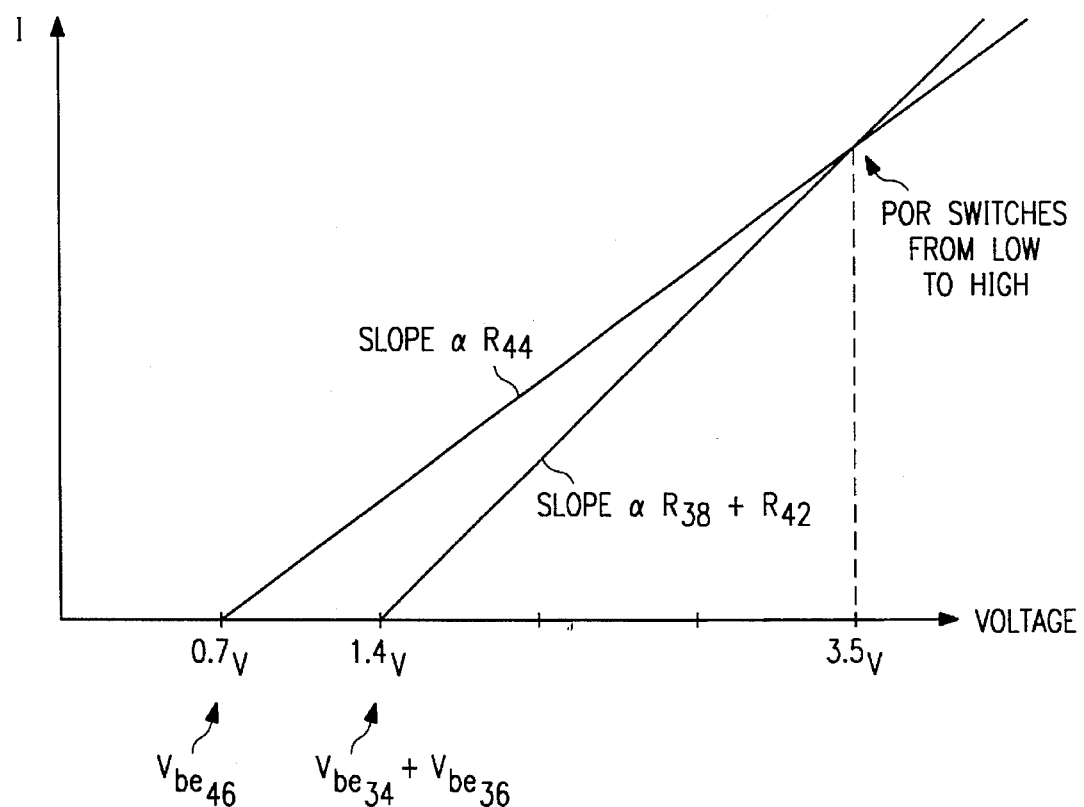
FIG. 4 is a graphical representation of the current flowing through two transistors as a function of the Vcc voltage.

In the preferred embodiment, resistor 38 has a resistance of 25K ohms, resistor 42 has a resistance of 4K ohms, and resistor 44 has a resistance of 43K ohms. With these resistor values, the current through the collectors of transistors 48 and 50 are shown in FIG. 4 as a function of the Vcc voltage. More specifically, the graph in FIG. 4 shows the current in transistor 50 beginning to flow when Vcc is about 0.7 volts. The current in transistor 48 begins to flow when the Vcc voltage reaches 1.4 volts. The current through transistor 48 equals the current through transistor 50 when Vcc is around 3.5 volts.

In equation form, the circuit changes states when:

$$(Vcc - V_{be46})/R_{44} = (Vcc - V_{be34} V_{be36})/(R_{38} + R_{42})$$

where $V_{be46}$ is the base to emitter voltage threshold for transistor 46, $V_{be34}$ is the base to emitter voltage threshold for transistor 34, $V_{be36}$ is the base to emitter voltage threshold for transistor 36

$R_{38}$, $R_{42}$, and $R_{44}$ are the resistance of resistors 38, 42, and 44, respectively.

The equation can be rewritten as:

$$Vcc \text{ (at the transition)} = [V_{be46}(R_{38}+R_{42}) - R_{44}(V_{be34}+V_{be36})]/(R_{38}+R_{42}-R_{44})$$

Additionally, for $V_{be34} = V_{be36} = V_{be46} = V_{be}$ $$VCC \text{ (at the transition)} = V_{be}[(R_{38}+R_{42}-2R_{44})/(R_{38}+R_{42}-R_{44})]$$

As explained above, the circuit has hysteresis since transistor 40 is turned on when the POR signal goes high. With transistor 40 on resistor 42 is bypassed which effectively increase the current through transistor 34 and 48. Consequently, Vcc will have to drop to a lower threshold voltage for the POR signal to change state than when Vcc was rising. The hysteresis of this circuit is described by the following equation:

$$V_{hys} = Vbe[(R_{38}+R_{42}-2_{44})/(R_{38}+R_{42}-R_{44}) - (R_{38}-2R_{44})/(R_{38}-R_{44})]$$

A designer skilled in the art can select resistor values to provide a hysteresis voltages which matches his application.

This preferred embodiment provides a power-on reset circuit which has no dependence on Vcc rise times and has a determinate output at the low Vcc voltage of 0.7 volts. Additionally, the hysteresis of the circuit is easily programmed by selecting resistor values, as described above. The preferred embodiment also offers the advantages of being a simple power-on reset circuit with a low component count and therefore high reliability. Also, the invention use a minimum area on an integrated circuit since the component count is low and no large capacitors are required.

Although the invention has been described and illustrated with a certain degree of particularity, it is understood that the present disclosure has been made only by way of example, and that numerous changes in the combination and arrangement of parts can be resorted to by those skilled in the art without departing from the spirit and scope of the invention, as hereinafter claimed.

We claim:

1. A power-on reset circuit for generating a power-on reset signal, said power-on reset circuit comprising:

a low voltage stage having an input connected to a voltage source and having an output connected to an output of the power-on reset circuit for pulling the power-on reset signal low responsive to the voltage source exceeding a first threshold voltage, wherein said low voltage stage further comprises a resistor in series with a current mirror;

a high voltage stage having an input connected to the voltage source and having an output connected to the output of the power-on reset circuit, for driving the power-on reset signal high when the voltage source exceeds a second threshold voltage; and a hysteresis circuit having a input connected to the output of the power-on reset circuit and an output connected to the high voltage stage for changing the second threshold value of the high voltage stage.

2. The power-on reset circuit of claim 1 wherein said current mirror comprises:

a first transistor having a control element and a conductive path; and a second transistor having a control element and a conductive path, wherein the conductive path of the first transistor connects the resistor to a voltage reference, the conductive path of the second transistor connects the output of the power-on reset circuit to the voltage reference, and the control element of the first transistor is connected to the resistor and to the control element of the second transistor.

3. The power-on reset circuit of claim 2 wherein said first and second transistors are a bipolar transistors.

4. The power-on reset circuit of claim 3 wherein said first and second transistors are a bipolar transistors.

5. The power-on reset circuit of claim 1 wherein said high voltage stage further comprises a current mirror in series with at least one p-n junction element which is in series with a plurality of resistors.

6. The power-on reset circuit of claim 5 wherein said current mirror comprises:

a first transistor having a control element and a conductive path; and a second transistor having a control element and a conductive path, wherein the conductive path of the first transistor connects the voltage source to the at least one p-n junction, the conductive path of the second transistor connects the voltage source to the output of the power-on reset circuit, and the control element of the first transistor is connected to the at least one p-n junction and to the control element of the second transistor.

7. The circuit of claim 6 wherein the first transistor and the second transistor are bipolar transistors.

8. The circuit of claim 7 wherein the bipolar transistors are PNP transistors.

9. The circuit of claim 5 wherein the at least one p-n junction element is a diode.

10. The circuit of claim wherein the plurality of resistors is a first resistor in series with a second resistor.

11. The circuit of claim 10 wherein the hysteresis circuit comprises a transistor having a conductive path across the second resistor and having a control element connected to the output of the power-on reset circuit so that the transistor bypasses the second transistor when the output of the power-on reset circuit goes high.

12. The circuit of claim 11 wherein the transistor comprises a n-channel field effect transistor.

13. A power-on reset circuit comprising:

a low power-on reset means for pulling a power-on reset signal low when a voltage source reaches a first threshold value, having an input connected to a voltage source and having an output connected to the output of the power-on reset circuit, wherein the low voltage means comprises a resistor in series with a current mirror;

a high voltage means for driving the power-on reset signal high when the voltage source is at a second threshold value, having an input connected to the voltage source voltage and having an output connected to the output of the power-on reset circuit; and a hysteresis means for providing hysteresis to the high voltage means, having an input connected to the output of the power-on reset circuit and having an output connected to the high voltage means.

14. The power-on reset circuit of claim 13 wherein the current mirror comprises:

a first NPN bipolar transistor having a collector and a base connected to the resistor, and an emitter connected to a voltage reference; and a second NPN bipolar transistor having a collector connected to the output of the power-on reset circuit, a base connected to the base of the first transistor, and an emitter connected to a voltage reference; such that current flows in the second transistor proportional to the current in the first transistor.

15. The power-on reset circuit of claim 13 wherein the high voltage means further comprises a current mirror in series with at at least one p-n junction element which is in series with a plurality of resistors.

16. The power-on reset circuit of claim 15 wherein the current mirror comprises:

a first PNP bipolar transistor having a collector and a base connected to the at least one p-n junction element, and an emitter connected to the voltage source; and a second PNP bipolar transistor having a collector connected to the output of the power-on reset circuit, a base connected to the base of the first transistor, and an emitter connected to the voltage source voltage; such that current flows in the second transistor proportional to the current in the first transistor.

17. A method for generating a power-on reset signal comprising:

sinking a power-on reset signal low when a voltage source reaches a first $V_{be}$ voltage threshold, wherein the step of pulling a reset power-on signal low is performed using a current mirror;

driving the power-on reset signal high when the voltage source reaches a second threshold value; and providing hysteresis to the power-on reset signal second threshold value is depends on whether the voltage source is by lowering the second threshold value responsive to the voltage source having reached the second threshold value.

* * * * *